United States Patent
Lee

(10) Patent No.: US 10,740,179 B2
(45) Date of Patent: Aug. 11, 2020

(54) MEMORY AND METHOD FOR OPERATING THE MEMORY

(71) Applicant: SK hynix Inc., Icheon-si Gyeonggi-do (KR)

(72) Inventor: Sungeun Lee, Incheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/182,928

(22) Filed: Nov. 7, 2018

(65) Prior Publication Data
US 2019/0163569 A1    May 30, 2019

(30) Foreign Application Priority Data
Nov. 29, 2017    (KR) .................. 10-2017-0161574

(51) Int. Cl.
| | | |
|---|---|---|
| *G06F 11/00* | (2006.01) | |
| *G06F 11/10* | (2006.01) | |
| *H03M 13/29* | (2006.01) | |
| *G11C 29/52* | (2006.01) | |
| *G11C 29/00* | (2006.01) | |
| *G11C 29/04* | (2006.01) | |

(52) U.S. Cl.
CPC ...... *G06F 11/1068* (2013.01); *G06F 11/1004* (2013.01); *G06F 11/108* (2013.01); *G11C 29/52* (2013.01); *G11C 29/70* (2013.01); *H03M 13/2906* (2013.01); *G11C 2029/0409* (2013.01); *G11C 2029/0411* (2013.01)

(58) Field of Classification Search
CPC ............ G06F 11/1068; G06F 11/1004; G06F 11/108; G11C 29/52
See application file for complete search history.

(56) References Cited

U.S. PATENT DOCUMENTS

| | | | | |
|---|---|---|---|---|
| 6,493,843 | B1 * | 12/2002 | Raynham | G06F 11/1012 714/763 |
| 8,173,387 | B2 * | 5/2012 | Takahashi | C12Q 1/025 435/29 |
| 8,928,399 | B2 * | 1/2015 | Koyanagi | G06F 3/0688 327/565 |
| 9,189,330 | B2 * | 11/2015 | Lastras | G06F 11/106 |
| 9,772,900 | B2 * | 9/2017 | Hu | G06F 11/108 |

(Continued)

FOREIGN PATENT DOCUMENTS

KR    1020170035795 A    3/2017

*Primary Examiner* — Esaw T Abraham
(74) *Attorney, Agent, or Firm* — William Park & Associates Ltd.

(57) ABSTRACT

An error correction method and a chip kill detection method of a memory including a plurality of chips may be provided. The method may include a first data error detection step of detecting whether an error exists in data outputted from the plurality of chips. The method may include a random error correction step of correcting an error occurred in data when it is detected in the first data error detection step that an error exists. The method may include a chip kill detection step of determining, when an error occurs even after the random error correction step, that a chip kill error has occurred, and detecting a chip where the chip kill error has occurred, by correcting the error through assuming one chip among the plurality of chips as a chip where the chip kill error has occurred.

14 Claims, 5 Drawing Sheets

(56) References Cited

U.S. PATENT DOCUMENTS

| | | | | |
|---|---|---|---|---|
| 9,853,013 | B2 * | 12/2017 | Koyanagi | G06F 3/0688 |
| 10,268,541 | B2 * | 4/2019 | Niu | G06F 11/1068 |
| 10,379,939 | B2 * | 8/2019 | Malladi | G06F 21/64 |

* cited by examiner

MEMORY AND METHOD FOR OPERATING THE MEMORY

CROSS-REFERENCES TO RELATED APPLICATION

The present application claims priority under 35 U.S.C. § 119(a) to Korean application number 10-2017-0161574, filed on Nov. 29, 2017, in the Korean Intellectual Property Office, which is incorporated herein by reference in its entirety.

BACKGROUND

1. Technical Field

Various embodiments generally relate to a memory technology, and, more particularly, to an error correction method and a chip kill detection method.

2. Related Art

A memory is configured to store data and output stored data. Data to be stored in the memory is stored in memory cells, and the memory is made up of an aggregate of a number of memory cells.

Because the memory is made up of a number of memory cells, the memory may include a relatively small number of failed memory cells or may include a relatively large number of failed memory cells.

Also, even though a memory cell is normal, erroneous data may be stored in the memory cell.

Technologies are being developed to allow a memory to store and output data normally even through erroneous data is stored in the memory or a failed memory cell exists due to many unstable factors.

SUMMARY

In an embodiment, an error correction method and a chip kill detection method of a memory including a plurality of chips may be provided. The method may include a first data error detection step of detecting whether an error exists in data outputted from the plurality of chips. The method may include a random error correction step of correcting an error occurred in data when it is detected in the first data error detection step that an error exists. The method may include a chip kill detection step of determining, when an error occurs even after the random error correction step, that a chip kill error has occurred, and detecting a chip where the chip kill error has occurred, by correcting the error through assuming one chip among the plurality of chips as a chip where the chip kill error has occurred.

DETAILED DESCRIPTION

Hereinafter, an error correction method and a chip kill detection method will be described below with reference to the accompanying drawings through various examples of embodiments.

Figure 1:
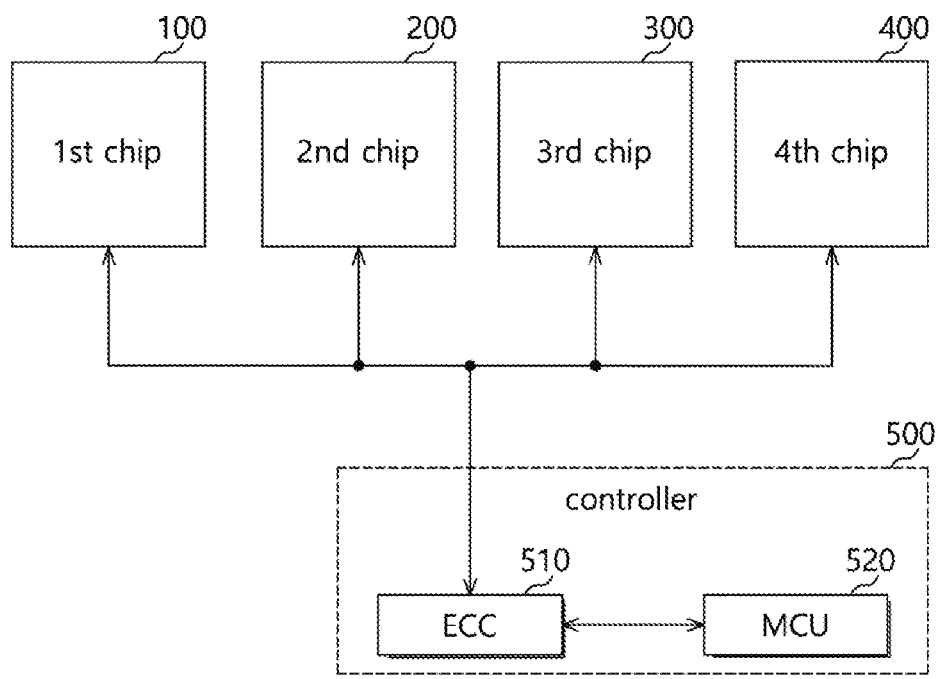
FIG. 1 is a configuration diagram illustrating a representation of an example of a memory in accordance with an embodiment.

Referring to FIG. 1, a memory in accordance with an embodiment may include a plurality of chips, for example, first to fourth chips 100, 200, 300 and 400, and a controller 500. In an embodiment, for example, the controller 500 may be implemented with software, hardware, or any combination thereof. In an embodiment, for example, the memory may be implemented with software, hardware, or any combination thereof.

The first to fourth chips 100, 200, 300 and 400 are electrically coupled with the controller 500, and are configured to transmit and receive data. In order to transmit and receive data to and from the controller 500, store data, and output stored data, each of the first to fourth chips 100, 200, 300, and 400 is configured to transmit and receive not only data but also control signals such as a command, an address, and a clock.

The controller 500 which transmits and receives data to and from the first to fourth chips 100, 200, 300 and 400 may be configured to recover data by using an error correction code when an error has occurred in data which are transmitted and received. The error correction code may include a Bose, Ray-Chaudhuri, Hocquenghem (BCH) code and a Reed-Solomon (RS) code. Also, in order to perform a data error check, a CRC (cyclic redundancy check) may be performed or a parity check may be performed. For example, the controller 500 may include an ECC (Error Correction Code) circuit 510 and a MCU (Micro Controller unit) circuit 520. The ECC circuit 510 may be configured to recover data using the error correction code when an error has been occurred in data which are transmitted and received to and from the first to fourth chips 100, 200, 300 and 400, the MCU circuit 520 may transmit an instruction for recovering data to the ECC circuit 510.

Figure 2:
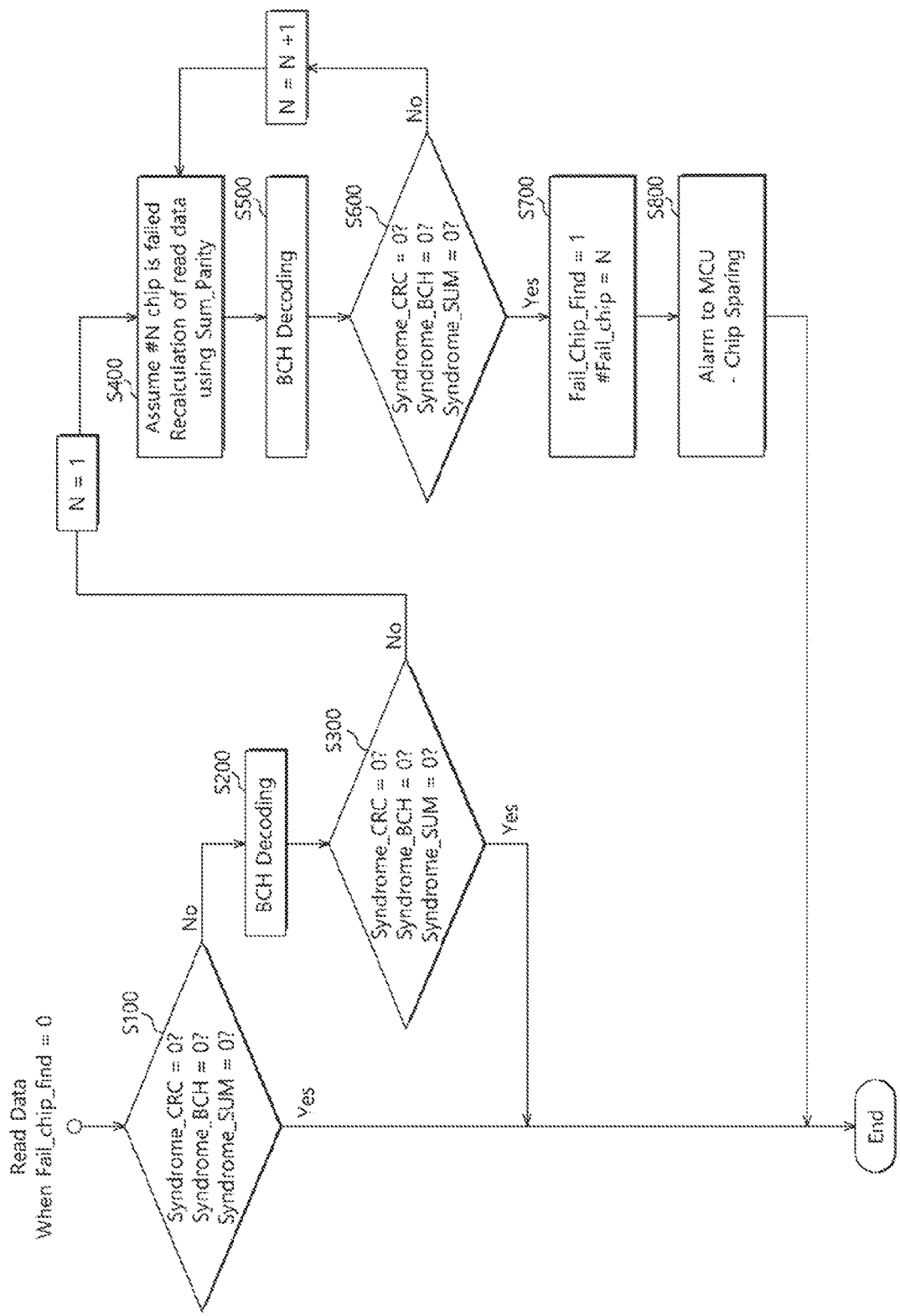
FIG. 2 is a representation of an example of a flow chart to assist in the explanation of an error correction method and a chip kill error detection method in accordance with an embodiment.

Referring to FIG. 2, a memory error correction method and a chip kill error detection method in accordance with an embodiment may include a first data error detection step S100, a random error correction step including steps S200 and S300, a chip kill detection step including steps S400, S500, S600 and S700, and a chip kill detection result output step including step S800. The steps S100 to s800 of FIG. 2 may be performed by the controller 500. For example, when a failed chip (chip kill) is not found (when Fail_chip_find=0), the MCU circuit 520 may instruct the ECC circuit 510 to perform steps S100 to S800. That is, the failed chip may mean the chip kill.

The first data error detection step S100 is a step of detecting whether an error exists in the data read from the first to fourth chips 100, 200, 300 and 400. The first data error detection step S100 may be performed by using a CRC, may be performed by using an error correction code (for example, a BCH code), and may be performed by using a sum-parity scheme employing an even parity scheme. The sum-parity scheme may be an error correction scheme in which the level of a parity bit is determined and stored depending on the number of bits having a high logic value (i.e., '1') among the bits of the parallel type data inputted to each of the first to fourth chips 100, 200, 300 and 400 and an error in the data outputted from each of the first to fourth chips 100, 200, 300 and 400 is corrected according to the value of the parity bit when performing error correction. While, in the first data error detection step S100 in accordance with an embodiment, a method of detecting an error by using all three schemes, the CRC scheme, the BCH decoding scheme, and the sum-parity scheme, in order for precise error detection may be employed in an example. However, in the embodiments, for example, it is possible to detect an error by separately using each scheme or by combining at least two of the three scheme.

In the first data error detection step S100, if an error does not exist using a CRC scheme (i.e., Syndrome_CRC=0), if an error does not exist using a check using the BCH decoding scheme (i.e., Syndrome_BCH=0), and if an error does not exist using a check using the sum-parity scheme (i.e., Syndrome_Sum=0), then an error to correct does not exist in the first to fourth chips 100, 200, 300 and 400, and, thus, the memory error correction method in accordance with an embodiment may be ended End.

However, if even one error exists in the first data error detection step S100, the random error correction step including steps S200 and S300 is entered.

The random error correction step including steps S200 and S300 may include a first error correction step S200 and a second data error detection step S300.

The first error correction step S200 may include a BCH decoding scheme using a BCH code. In the first error correction step S200, an operation of correcting an error by using a BCH code for the data read from the first to fourth chips 100, 200, 300 and 400 is performed.

The second data error detection step S300 as a step for detecting whether an error is correctly corrected in the first error correction step S200 may be performed in the same manner as the first data error detection step S100.

If all the errors within the data are corrected in the first error correction step S200, and since no error is detected in the second data error detection step S300 (i.e., Syndrome_CRC=0, Syndrome_BCH=0 and Syndrome_Sum=0), then the memory error correction method according to an embodiment may be ended End.

If an error within the data is not correctly corrected in the first error correction step S200, the error may be detected in the second data error detection step S300.

If an error is detected in the second data error detection step S300, the chip kill detection step including steps S400, S500, S600 and S700 is performed. That is to say, in the chip kill error detection method in accordance with an embodiment, when the data outputted from the first to fourth chips 100, 200, 300 and 400 are not correctly corrected, it is determined that a chip kill error has occurred in one chip among the first to fourth chips 100, 200, 300 and 400.

The chip kill detection step, including the steps S400, S500, S600 and S700, may include a second, first error correction step S400, a second, second error correction step S500, a third data error detection step S600, and a chip kill information storage step S700.

The second, first error correction step S400 is a step of correcting an error by assuming one chip among the first to fourth chips 100, 200, 300 and 400 has the error. In an embodiment, for example, a step of correcting an error by assuming the first chip 100 has the error will be described.

For example, the second, first error correction step S400 may be a step of correcting an error by using sum-parity scheme for the data read from the first chip 100 after assuming that a chip kill error has occurred in the first chip 100. Correcting an error (correcting data including a chip kill error) by using the sum-parity scheme and the BCH scheme may correct more bits of data than correcting an error by using only the BCH scheme (random error correction). Thus, the second, second error correction step S500 may be entered after second, first error correction step S400.

The second, second error correction step S500 may be similar to a step of correcting the data corrected in the second, first error correction step S400, which is, using the BCH scheme again. For example, the second, second error correction step S500 may be a step of correcting an error by decoding the data corrected in the second, first error correction step S400, by using a BCH code.

The third data error detection step S600 may be used as a step for detecting whether an error has been correctly corrected in the second, second error correction step S500 and may be performed in the same manner as the first and second data error detection steps S100 and S300.

If an error is correctly corrected, it may be determined in the third data error detection step S600 that a chip kill error has occurred in the first chip 100. If it is determined in the third data error detection step S600 that a chip kill error has occurred in the first chip 100, the chip kill information storage step S700 is performed.

The chip kill information storage step S700 may include a step of storing information that a chip kill error has occurred in the first chip 100, in a device including an ECC calculation circuit, for example, the controller 500.

The chip kill detection result output step S800 may include a step of outputting information that a chip kill error has occurred in the first chip 100, to the controller 500.

If the chip kill detection result output step S800 is completed, the memory error correction method and the chip kill detection method in accordance with an embodiment may be ended.

If an error is not correctly corrected, it is determined in the third data error detection step S600 that a chip kill error has not occurred in the first chip 100, and the second-first error correction step S400 and the second-second error correction step S500 are performed again for the second chip 200.

Thereafter, if it is determined that a chip kill error has occurred in the second chip 200, the chip kill information storage step S700 and the chip kill detection result output step S800 are performed. If it is determined that a chip kill error has not occurred in the second chip 200, the second, first error correction step S400 and the second, second error correction step S500 are performed again for the third chip 300. Such operations may be performed for each of all the chips to determine which chip the chip kill error has occurred, to store the chip kill information for the chip kill error, and to output the chip kill detection result relating to the chip kill error.

Figure 3:
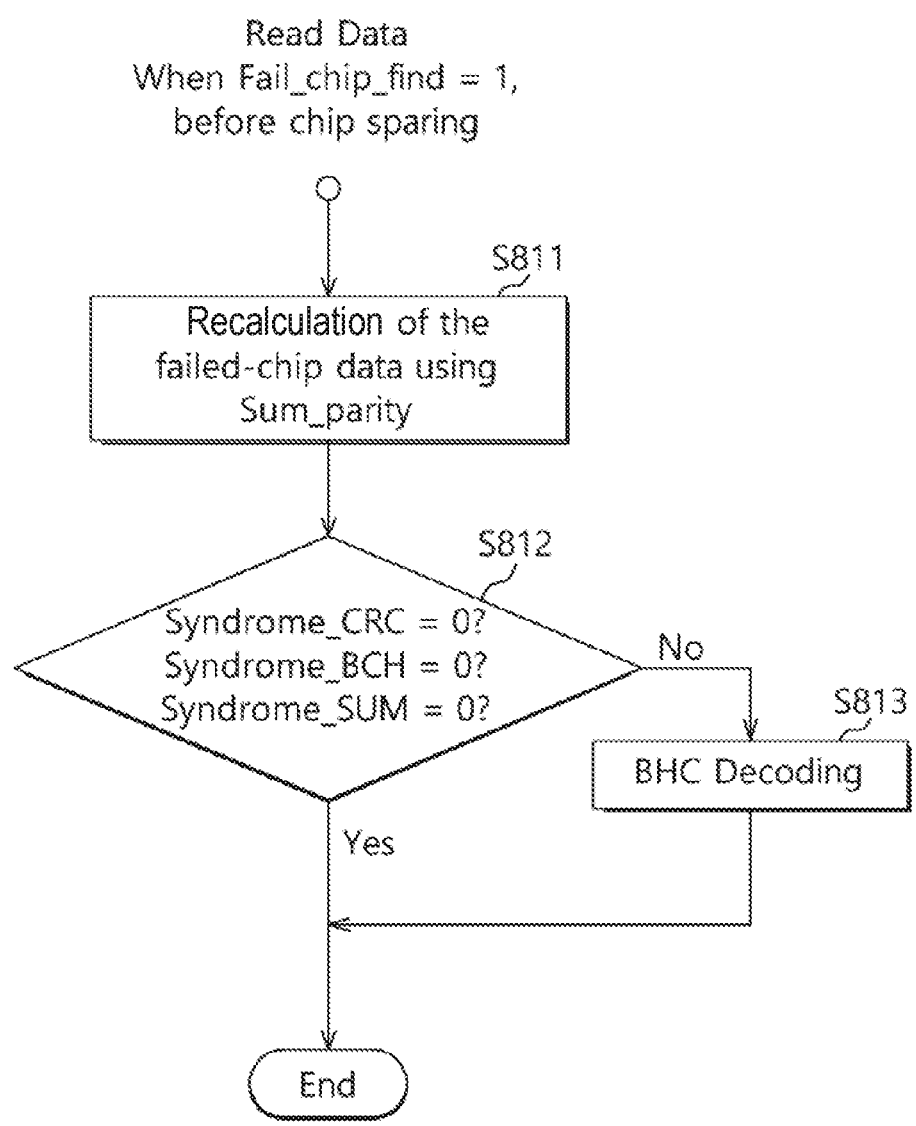
FIG. 3 is a representation of an example of a flow chart to assist in the explanation of a memory error correction method after the chip kill error detection method of FIG. 2.

After the chip kill detection result output step S800 is completed, the data outputted from the first to fourth chips 100, 200, 300 and 400 may be outputted through being corrected by an error correction method as illustrated in FIG. 3. Steps S811 to S813 of FIG. 3 may be performed by the controller 500. For example, when a failed chip (chip kill) is found (when Fail_chip_find=1), the MCU circuit 520 may instruct the ECC circuit 510 to perform steps S811 to S813. Descriptions will be made on the assumption, for example, that a chip kill error has occurred in the first chip 100.

The error correction method illustrated in FIG. 3 may include a third, first error correction step S811, a fourth data error detection step S812 and a third second error correction step S813.

The a third, first error correction step S811 is a step of correcting an error of data by using the sum-parity scheme for the data read from a chip where a chip kill error has occurred and the data read from other normal chips.

The fourth data error detection step S812 is a step of detecting whether an error exists in the data corrected in the a third, first error correction step S811.

If data is correctly corrected in the third-first error correction step S811, the error correction method illustrated in FIG. 3 is ended. However, if it is determined that data is not correctly corrected in the third-first error correction step S811, the third-second error correction step S813 of correcting an error by using the BCH decoding scheme is performed, and then, the error correction method illustrated in FIG. 3 may be ended.

Figure 4:
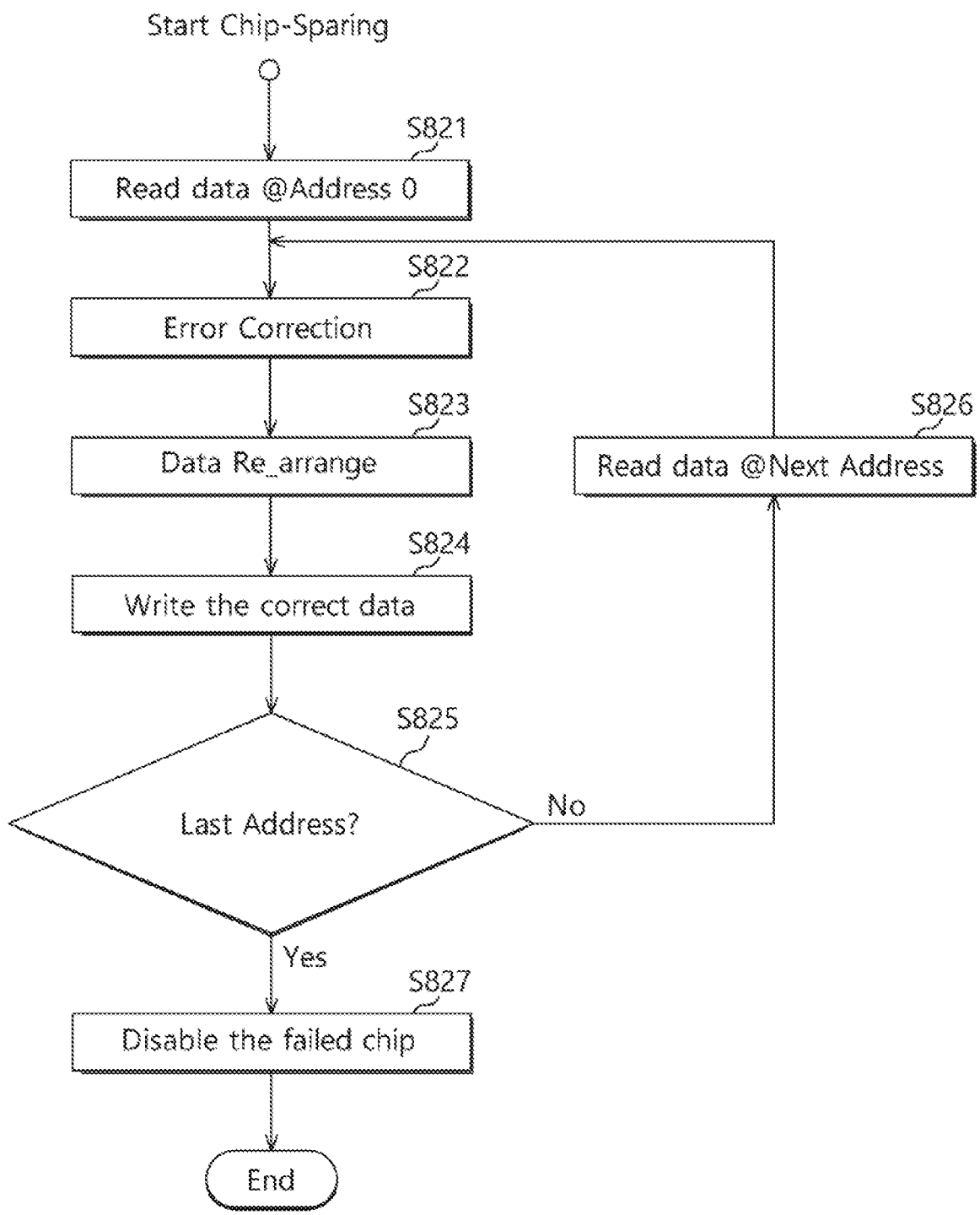
FIG. 4 is a representation of an example of a flow chart to assist in the explanation of a chip repair method after the chip kill error detection method of FIG. 2.

After the error correction method and the chip kill error detection method illustrated in FIG. 2 are ended, a chip repair method for a chip where a chip kill error has occurred may be performed as illustrated in FIG. 4.

The chip repair method illustrated in FIG. 4 is a process of moving all the data from a chip where a chip kill error has occurred, to a spare chip or a repair chip. In an embodiment, for example, a spare chip or repair chip may be a chip that is different from the chip where the chip kill error has occurred and has been found by the chip kill error detection method. Steps S821 to S827 of FIG. 4 may be performed by the controller 500. For example, when chip-sparing operation is performed, the MCU circuit 520 may instruct the ECC circuit 510 to perform steps S821 to S827.

The chip repair method may include a first read step S821, a fourth error correction step S822, a data rearrangement step S823, a write step S824, an address checking step S825, a second read step S826, and a chip deactivation step S827.

The first read step S821 is a step of reading data from a first address of a chip where a chip error has occurred.

The fourth error correction step S822 is a step of correcting an error of the data read in the first read step S821.

The data rearrangement step S823 is a step of storing the data corrected in the fourth error correction step S822, in a position (the same chip where the chip kill error has occurred or another chip where the chip kill error has not occurred) different from a position where original data is stored.

The write step S824 is a step of storing the data stored in the different position in the data rearrangement step S823, in the spare chip or the repair chip.

The address checking step S825 is a step of checking whether the address of the data stored in the write step S824 is the final address or last address of the chip where the chip kill error has occurred.

If it is determined in the address checking step S825 that the address is not the final address and there are other addresses, then the second read step S826 of reading data corresponding to an address next to the address of the data stored in the write step S824, that is, the address of the data read in the first read step S821, may be performed. After the second read step S826 is performed, the fourth error correction step S822, the data rearrangement step S823, the write step S824 and the address checking step S825 are repeatedly performed until the final address or last address is reached. In an embodiment, for example, after the second read step S826 is performed, the fourth error correction step S822, the data rearrangement step S823, the write step S824 and the address checking step S825 are repeatedly performed until all the data from a chip where a chip kill error has occurred is moved to a spare chip or a repair chip. In an embodiment, for example, determining whether all of the data from a chip where a chip kill error has occurred is moved to a spare chip or a repair chip may be based on whether a final address or last address has been checked in the address checking step S825.

If the final address or last address is reached, then it is determined that all the data of the chip where the chip kill error has occurred have been correctly moved to the spare chip or the repair chip, and the chip deactivation step S827 of deactivating the chip where the chip kill error has occurred is performed.

As is apparent from the above descriptions, in the memory error correction method in accordance with an embodiment, an operation of correcting data of all chips by using a BCH scheme is performed, and the memory error correction method is ended when the data are correctly corrected. However, if the data of all chips are not corrected by using the BCH scheme, an operation of correcting an error of data is performed alternately for one chip by using a sum-parity scheme and the BCH scheme to find a chip where a chip kill error has occurred, and the found chip is replaced with another chip. Also, a chip where errors have occurred more than other chips may be replaced with a spare chip or a repair chip, and an operation of moving the data of the chip where more errors have occurred, to the spare chip or the repair chip may be performed.

The memory and methods thereof as discussed above (see FIGS. 1-4) are particular useful in the design of other memory devices, processors, and computer systems. For example, referring to FIG. 5, a block diagram of a system employing a memory and or method thereof in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one memory and or method as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one memory and or method as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

Figure 5:
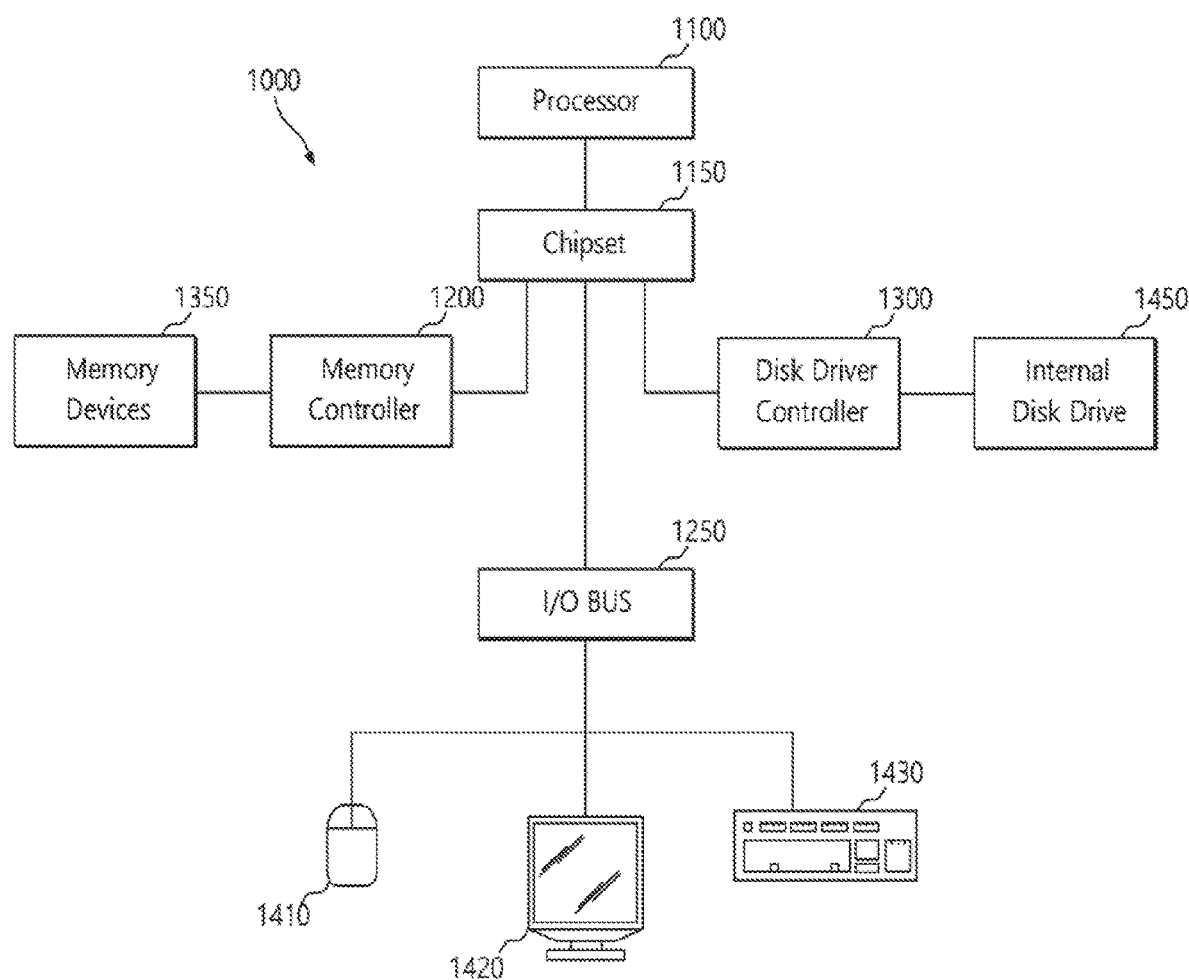
FIG. 5 illustrates a block diagram of an example of a representation of a system employing a memory and or method with the various embodiments discussed above with relation to FIGS. 1-4.

It is important to note that the system 1000 described to above in relation to FIG. 5 is merely one example of a system including a memory and or employing the methods as discussed above with relation to FIGS. 1-4. In alternate embodiments, such as, for example but not limited to, cellular phones or digital cameras, the components may differ from the embodiments illustrated in FIG. 5.

While various embodiments have been described above, it will be understood to those skilled in the art that the embodiments described are examples only. Accordingly, the memory error correction method, the chip kill error detection method, the error correction method, and chip repair method described herein should not be limited based on the described embodiments.

What is claimed is:

1. A method of operating a memory, the method comprising:

performing a memory error correction method and a chip kill error detection method on the memory, which includes a plurality of chips coupled to a controller, the memory error correction method and the chip kill error detection method comprising:

performing, by the controller, a first data error detection step of detecting whether an error exists in data output to the controller from each chip of the plurality of chips;

after the first data error detection step, performing, by the controller, a second error correction step of correcting an error that occurred in the data output to the controller when an error is detected by the first data error detection step; and after the second error correction step, performing, by the controller, a chip kill detection step of determining, when an error occurs, after the second error correction step, that a chip kill error has occurred, and identifying a particular chip of the plurality of chips where the chip kill error has occurred, by correcting the error through sequentially assuming one chip among the plurality of chips as a chip where the chip kill error has occurred.

2. The method of claim 1, wherein the first data error detection step is a step of detecting an error of data by using at least one scheme among a cyclic redundancy check (CRC) scheme, a Bose, Ray-Chaudhuri, Hocquenghem (BCH) code scheme, and a sum-parity scheme.

3. The method of claim 2, wherein the sum-parity scheme includes a scheme in which a level of a parity bit is determined and stored depending on the number of bits having a high logic value among bits of parallel type data inputted to each of the plurality of chips and an error of data is corrected according to a value of the stored parity bit when performing error correction.

4. The method of claim 3, wherein the sum-parity scheme includes an even-parity scheme.

5. The method of claim 1, wherein the random error correction step comprises: a first error correction step of correcting an error of data by using a BCH code; and a second data error detection step of detecting whether data corrected in the first error correction step is correctly corrected.

6. The method of claim 5, wherein the first data error detection step is a step of detecting an error of data by using at least one scheme among a plurality of schemes, and wherein the second data error detection step detects an error of data using the same schemes as the first data error detection step.

7. The method of claim 6, wherein the chip kill detection step comprises: a second error correction step of correcting an error of data by using the sum-parity scheme and the BCH scheme through assuming one chip among the plurality of chips as a chip where the chip kill error has occurred; a third data error detection step of detecting whether data corrected in the second error correction step is correctly corrected, using the same schemes as the first data error detection step; and a step of performing the second error correction step through assuming a next chip as a chip where the chip kill error has occurred, when an error is detected in the third data error detection step, or storing information that the assumed chip is the chip where the chip kill error has occurred, when an error is not detected in the third data error detection step.

8. The method of claim 7, further comprising: a chip kill detection result output step of outputting, when the information of the chip where the chip kill error has occurred is stored, the information to the controller.

9. The method of claim 8, further comprising: a third, first error correction step of correcting data in the sum-parity scheme based on the chip where the chip kill error has occurred, when the chip where the chip kill error has occurred is detected among the plurality of chips; a fourth data error detection step of detecting whether an error exists in data corrected in the third-first error correction step; and a third second error correction step of correcting again the data corrected in the a third, first error correction step, by using the BCH scheme, when an error is detected in the fourth data error detection step.

10. The method of claim 9, wherein the fourth data error detection step detects an error of data using the same schemes as the first data error detection step.

11. The method of claim 1, further comprising: a step of moving data of the chip where the chip kill error has occurred, to another chip, when the chip where the chip kill error has occurred is detected among the plurality of chips in the chip kill detection step.

12. The method of claim 11, wherein another chip includes a repair chip or a spare chip.

13. The method of claim 12, wherein the step of moving the data of the chip where the chip kill has occurred, to another chip, comprises: a first read step of reading data for a first address of the chip where the chip kill error has occurred; a fourth error correction step of correcting an error of the data read in the first read step; a data rearrangement step of storing the data corrected in the fourth error correction step, in a position different from a position where original data is stored; a write step of storing the data stored in the data rearrangement step, in the spare chip or the repair chip; an address checking step of checking whether an address of the data stored in the write step is a final address of the chip where the chip kill error has occurred; and a second read step of reading an address next to the data read in the first read step, when it is checked in the address checking step that the address is not the final address.

14. The method of claim 13, wherein the first read step, the fourth error correction step, the data rearrangement step, the write step, the address checking step and the second read step are repeated until an address of the data read in the first read step is the final address.

* * * * *

UNITED STATES PATENT AND TRADEMARK OFFICE
CERTIFICATE OF CORRECTION

PATENT NO. : 10,740,179 B2
APPLICATION NO. : 16/182928
DATED : August 11, 2020
INVENTOR(S) : Sungeun Lee Page 1 of 1

It is certified that error appears in the above-identified patent and that said Letters Patent is hereby corrected as shown below:

On the Title Page

Item (54):
Replace "MEMORY AND METHOD FOR OPERATING THE MEMORY" with --MEMORY AND METHOD OF OPERATING THE MEMORY--

Item (72) Inventor:
Replace "Sungeun LEE, Incheon-si (KR)" with --Sungeun LEE, Icheon-si Gyeonggi-do (KR)--

Signed and Sealed this
Thirteenth Day of October, 2020

Andrei Iancu
*Director of the United States Patent and Trademark Office*